(12) United States Patent
Kim

(10) Patent No.: US 7,605,674 B2
(45) Date of Patent: Oct. 20, 2009

(54) RADIO FREQUENCY SWITCH

(75) Inventor: Duk-Yong Kim, Yongin-si (KR)

(73) Assignee: KMW Inc., Yongin-Si, Gyeonggi-Do (KR)

( * ) Notice: Subject to any disclaimer, the term of this patent is extended or adjusted under 35 U.S.C. 154(b) by 0 days.

(21) Appl. No.: 12/151,681

(22) Filed: May 8, 2008

(65) Prior Publication Data

US 2008/0290963 A1  Nov. 27, 2008

Related U.S. Application Data

(63) Continuation of application No. PCT/KR2005/004068, filed on Nov. 30, 2005.

(30) Foreign Application Priority Data

Nov. 8, 2005  (KR)  ............... 2005-106689

(51) Int. Cl.
  *H01P 1/10*  (2006.01)
  *H01P 3/08*  (2006.01)
(52) U.S. Cl. ...................... 333/103; 333/246
(58) Field of Classification Search ............... 333/101, 333/103, 104, 246, 247, 121, 122, 125; 343/767, 343/770
  See application file for complete search history.

(56) References Cited

U.S. PATENT DOCUMENTS

| | | | | |
|---|---|---|---|---|
| 3,946,339 A | * | 3/1976 | Oltman et al. | 333/121 |
| 5,047,829 A | | 9/1991 | Seymour et al. | 357/58 |
| 5,257,411 A | | 10/1993 | Minasi | 455/80 |
| 6,591,086 B1 | | 7/2003 | Pleasant | 455/78 |
| 6,657,600 B2 | * | 12/2003 | Thudor et al. | 343/770 |
| 7,057,568 B2 | * | 6/2006 | Louzir et al. | 343/767 |
| 2008/0290962 A1 | * | 11/2008 | Kim et al. | 333/103 |

FOREIGN PATENT DOCUMENTS

| | | |
|---|---|---|
| JP | 10-256937 | 9/1998 |
| KR | 2002-44827 | 6/2002 |
| KR | 2004-2179 | 1/2004 |
| WO | WO 96/13101 | 5/1996 |

* cited by examiner

*Primary Examiner*—Dean O Takaoka
(74) *Attorney, Agent, or Firm*—Cha & Reiter, LLC

(57) ABSTRACT

An RF switch is provided. In the RF switch, a slot line is divided into a first slot line and a second slot line and an open-end circuit is provided at each end portion of the first and second slot lines. A first transmission line delivers signals from and to the first slot line, and a second transmission line delivers signals from and to the second slot line. A third transmission line delivers signals from and to the portion of the slot line that separates the first slot line from the second slot line. A variable sub open-end circuit portion includes at least one open-end circuit which is selectively switched to the first or second slot line according to an external switching control signal.

14 Claims, 7 Drawing Sheets

RADIO FREQUENCY SWITCH

This application is a Continuation of PCT/KR2005/004068 filed on Nov. 30, 2005.

FIELD OF THE INVENTION

The present invention relates generally to a Radio Frequency (RF) switch, and in particular, to an RF switch suitable as a switch for switching between a transmission signal and a received signal at a signal transmission/reception (Tx/Rx) end in a Time Division Duplexing (TDD) system.

DESCRIPTION OF THE RELATED ART $2^{nd}$ and $3^{rd}$ generation mobile communication systems are mostly based on Frequency Division Duplexing (FDD). A duplexer separates a Tx signal from an Rx signal in FDD. In comparison, $3.5^{th}$ and $4^{th}$ generation mobile communication systems are expected to use TDD.

In time-division transmission schemes including TDD, communications are carried out with the same radio frequency time-divided between transmission and reception. One frame is divided for transmission and reception, for bi-directional communications by one frequency.

FIG. 1 is a block diagram of Tx and Rx ends in a typical TDD system. Referring to FIG. 1, a Tx signal passes through a first Tx filter 30, is amplified to an appropriate power level in a power amplifier 40, is filtered in a second Tx filter 50, and then is radiated through an antenna (ANT) 60 through a Tx-Rx switch 10. For reception, a signal received through the ANT 60 is switched to an Rx filter 20 by the Tx-Rx switch 10 and passes through the Rx filter 20 only in an Rx frequency band. The Tx-Rx switch 10 switches according to a switching control signal received from a controller (not shown).

As described above, transmission alternates with reception on the same frequency every predetermined time period. That's why a high-speed Tx-Rx RF switch is needed.

Due to the requirement of high-speed switching, the RF switch uses a switch based on a semiconductor device such as a PIN diode or a Field Effect Transistor (FET) rather than a mechanical switch. However, the semiconductor switch is not feasible for high power because of the high power susceptibility of semiconductor.

When a high power is applied, much heat is created and thus without sufficient heat proofness, the switch is destroyed. An RF switch developed to withstand high power is equipped with a separately procured cooler and thus the RF switch is very expensive and hard to fabricate. Therefore, the RF switch is limited to military use.

To solve this problem, the TDD system used a circulator instead of an RF switch to separate a Tx signal from an Rx signal. However, the use of the circulator also has the distinctive drawback that sufficient isolation from a Tx signal during reception is difficult to achieve and in an open state caused by some defects in an antenna, the Tx signal is introduced into a receiver, thereby causing system malfunction or seriously decreasing the quality of the Rx signal.

DETAILED DESCRIPTION OF THE INVENTION

An object of the present invention is to substantially solve at least the above problems and/or disadvantages and to provide at least the advantages below. Accordingly, an object of the present invention is to provide an RF switch suitable for Tx-Rx switching in a TDD system for ensuring sufficient isolation between a Tx end and an Rx end.

Another object of the present invention is to provide an RF switch suitable for Tx-Rx switching in a TDD system for preventing introduction of Tx power into an Rx end when an antenna is opened.

A further object of the present invention is to provide an RF switch including a semiconductor device but having sufficient heat-proofness, for stably operating at high power.

Still another object of the present invention is to provide an RF switch easily fabricated in the form of a Microwave Integrated Circuit (MIC).

Yet another object of the present invention is to provide an RF switch for operating even in an RF band of tens of giga hertz or above as well as in a mobile communication frequency band.

The above objects are achieved by providing an RF switch. In the RF switch, a slot line is divided into a first slot line and a second slot line and an open-end circuit is provided at each end portion of the first and second slot lines. A first transmission line delivers signals from and to the first slot line, and a second transmission line delivers signals from and to the second slot line. A third transmission line delivers signals from and to the portion of the slot line that separates the first slot line from the second slot line. A variable sub-open-end circuit portion includes at least one open-end circuit which is selectively switched to the first or second slot line according to an external switching control signal

EMBODIMENTS

Preferred embodiments of the present invention will be described herein below with reference to the accompanying drawings. In the following description, well-known functions or constructions are not described in detail since they would obscure the invention in unnecessary detail.

Figure 2:
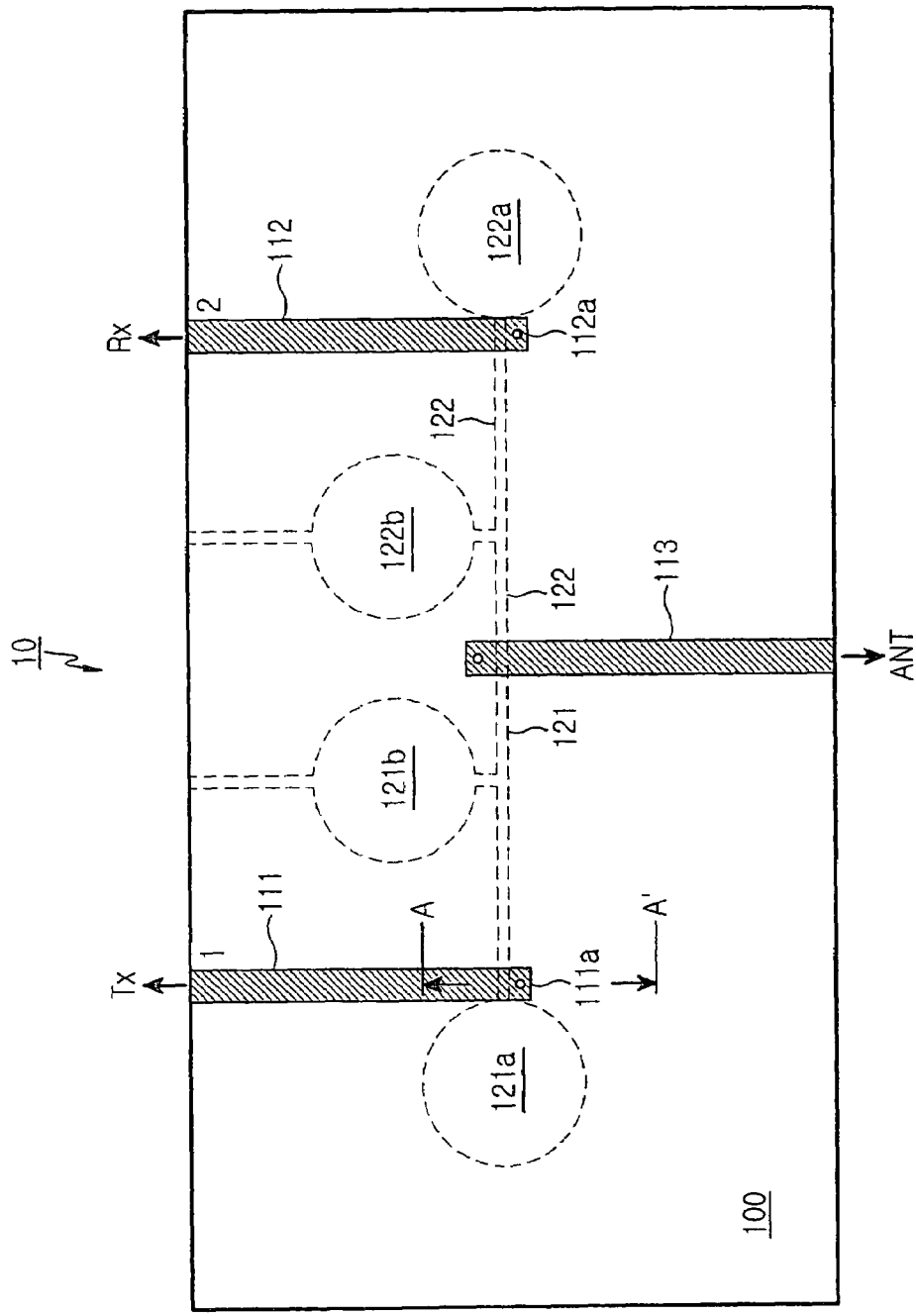
FIG. 2 is a plan view of the circuit pattern of the Printed Circuit Board (PCB) of an RF switch for Tx-Rx switching in a TDD system according to an embodiment of the present invention.
Figure 3:
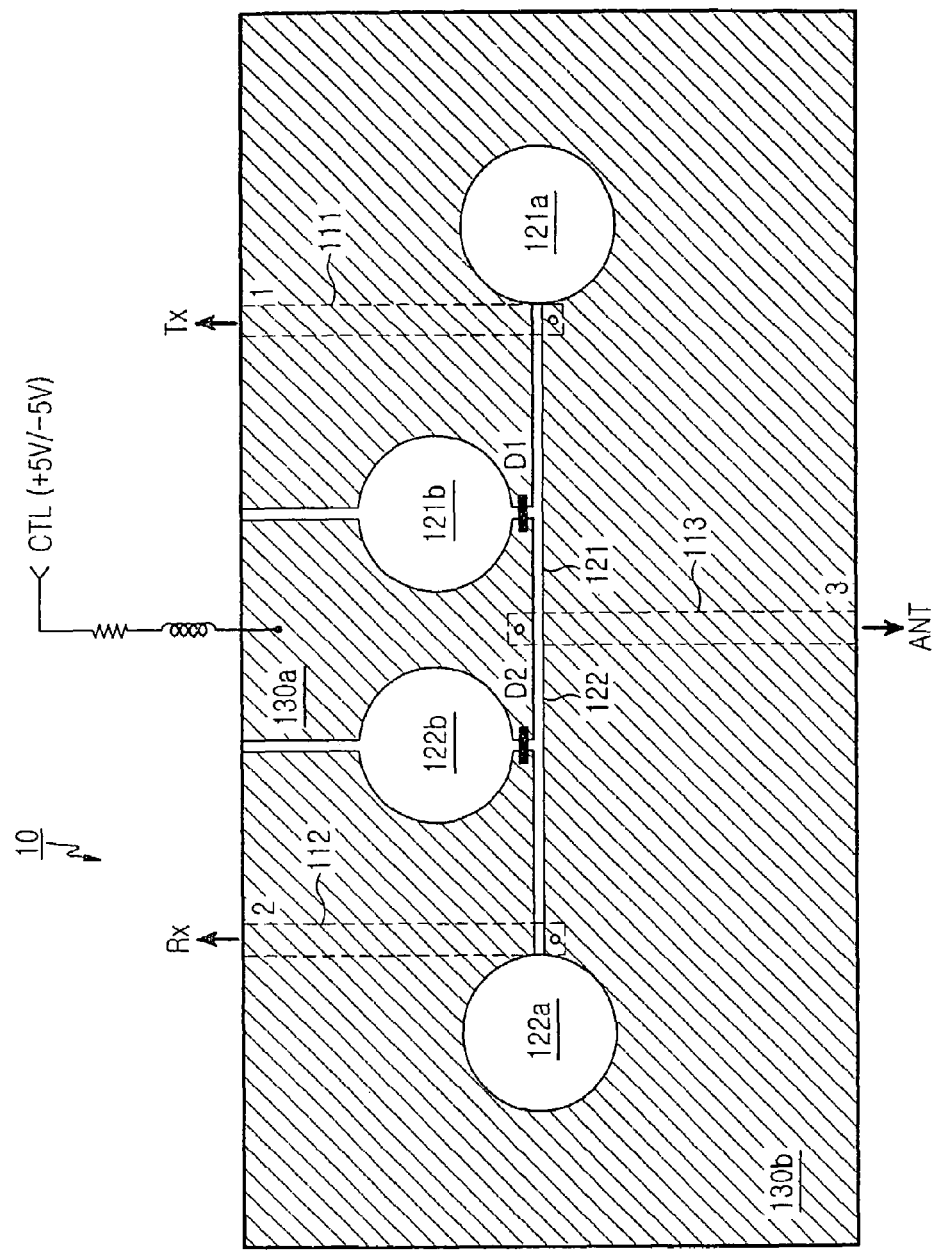
FIG. 3 is a bottom view of the circuit pattern of the PCB illustrated in FIG. 2.

FIG. 2 is a plan view of the circuit pattern of the PCB of an RF switch for Tx-Rx switching in a TDD system according to an embodiment of the present invention and FIG. 3 is a bottom view of the circuit pattern of the PCB illustrated in FIG. 2. The size and shape of each component is more or less enlarged or simplified for better understanding. Referring to FIGS. 2 and 3, in an RF switch 10 according to an embodiment of the present invention, a slot line 121-122 is formed beneath a dielectric substrate 100. The slot line 121-122 is divided into a first slot line 121 and a second slot line 122 and open-end circuits 121a and 122a are formed at ends of the first and second slot lines 121 and 122. First and second microstrip lines 111 and 112 are formed across the ends of the first and second slot lines 121 and 122 on the dielectric substrate 100, for microstrip-slot line coupling. A third microstrip line 113 is formed, for microstrip-slot line coupling, at a portion of the slot line 121-122 where the first and second slot lines 121 and 122 are divided.

The RF switch further includes a variable sub open-end circuit portion with at least one open-end circuit to be connected selectively to the first or second slot line 121 or 122 according to a switching control signal CTL. As illustrated in FIGS. 2 and 3, the variable sub open-end circuit portion includes a first sub open-end circuit 121b connected to the first slot line 121, a second sub open-end circuit 122b connected to the second slot line 122, and a switching circuit for forming mutually exclusive connection paths which connect the first sub open-end circuit 121b to the first slot line 121 and the second sub open-end circuit 122b to the second slot line 122 according to the switching control signal CTL. The switching circuit, may have first and second switching devices, that is, first and second diodes D1 and D2 for selectively shorting the gap of a connection between the first sub open-end circuit 121b and the first slot line 121 or the gap of a connection between the second sub open-end circuit 122b and the second slot line 122.

In the RF switch 10 having the above configuration, the first, second and third microstrip lines 111, 112 and 113 form first, second and third ports 1, 2 and 3. The first or second port 1 or 2 is selectively connected to the third port 3 according to the switching control signal CTL.

The microstrip lines 111, 112 and 113 and the slot lines 121 and 122 are formed on and beneath the dielectric substrate 100 having an appropriate dielectric constant. The bottom of the dielectric substrate 100 is divided into ground plates 130a and 130b on which the slot line 121-122 is formed. The open-end circuits 121a and 122a and the first and second sub open-end circuits 121b and 122b are shaped into circles empty inside. The first and second ground plates 130a and 130b are electrically separated from each other in the illustrated case of FIG. 3.

Figure 6:
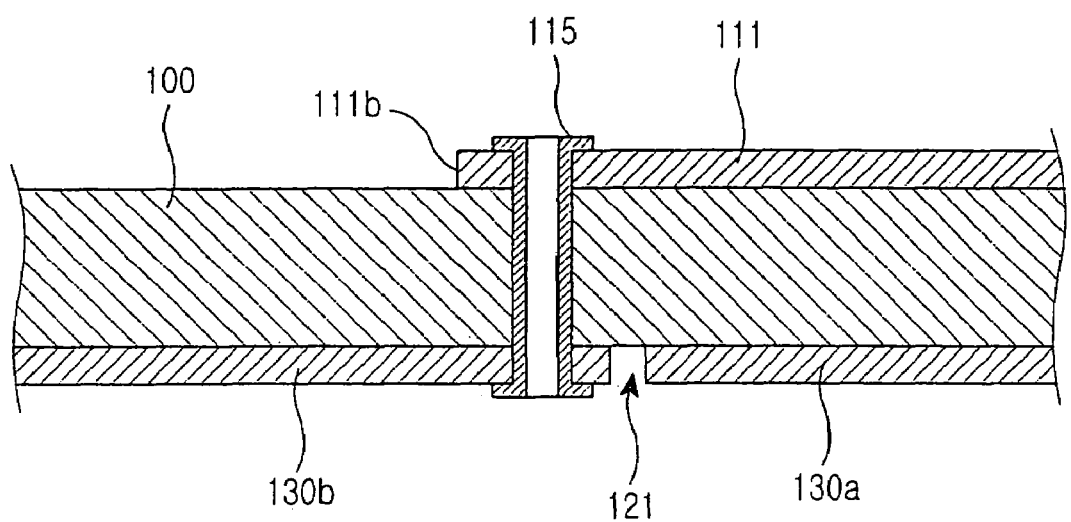
FIG. 6 is a partial sectional view of a short-end circuit of a microstrip line illustrated in FIG. 2.

The first, second and third microstrip lines 111, 112 and 113 are also provided, at one ends thereof, with open-end or short-end circuits. In the present invention, short-end circuits are formed at the ends of the microstrip lines 111, 112 and 113. As illustrated in FIG. 6, these short-end circuits 111a, 112a and 113a are formed by forming a circular hole at the end of each microstrip line and plating the inside of the hole with an appropriate conductive plating material 115, such that they are connected to the ground plate 130a or 130b.

The first and second diodes D1 and D2 are installed across the gap of the connection between the first sub open-end circuit 121b and the first slot line 121 and the gap of the connection between the second sub open-end circuit 122b and the second slot line 122, for receiving the switching control signal CTL (i.e. a bias voltage) from the controller (not shown). The on and off operations of the first and second diodes D1 and D2 are mutually exclusive so that the first or second slot line 121 or 121 is selectively connected to a corresponding sub open-end circuit.

Figure 4:
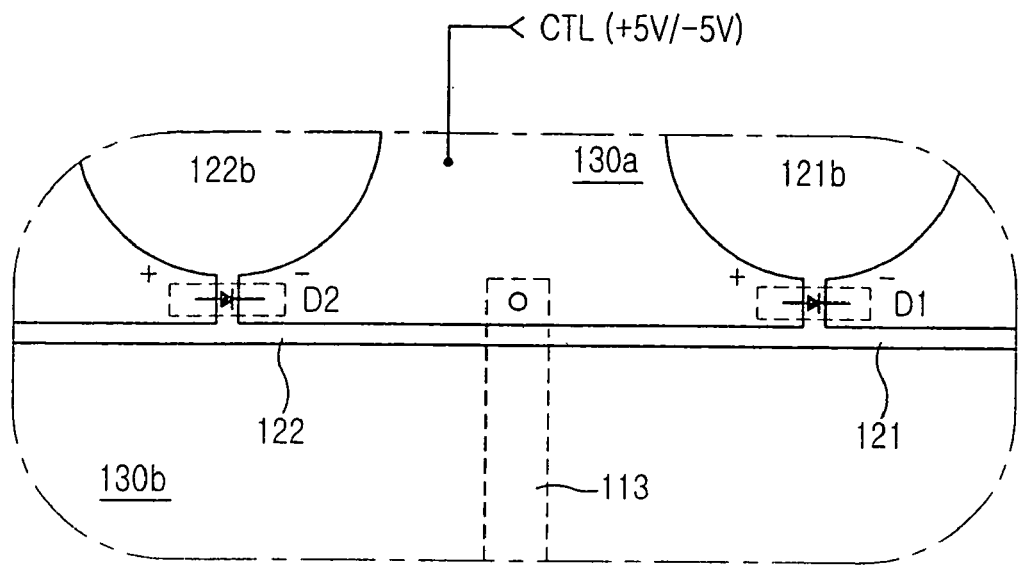
FIG. 4 is a detailed view of diode connected portions illustrated in FIG. 3.
Figure 5:
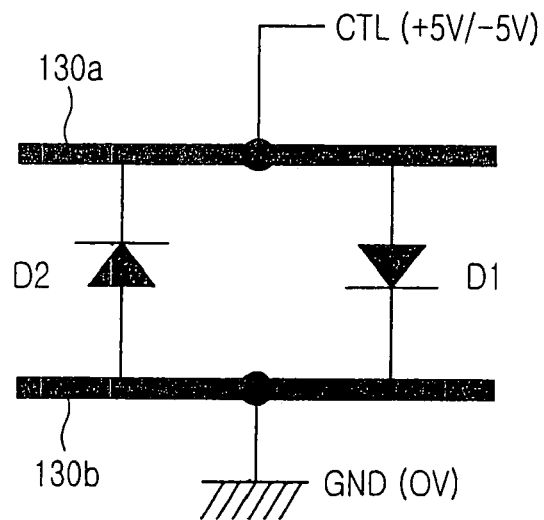
FIG. 5 is an equivalent circuit diagram of FIG. 4.

FIG. 4 is a detailed view of the diode connected portions illustrated in FIG. 3 and FIG. 5 is an equivalent circuit diagram of FIG. 4. With reference to FIGS. 4 and 5, the on and off switching of the first and second diodes D1 and D2 and the connection of the first or second slot line 121 or 122 to a corresponding sub open-end circuit will be described in great detail. The first and second diodes D1 and D2 are installed with opposite polarities across the gap of the connection between the first slot line 121 and the first sub open-end circuit 121b and the gap of the connection between the second slot line 122 and the second sub open-end circuit 122b. An appropriate bias voltage, for example, a switching control signal CTL of +5V or −5V is selectively applied to the first ground plate 130a such that the first and second diodes D1 and D2 connected between the first ground plate 130a and the second ground plate 130b of 0V are mutually exclusively on and off.

With the first or second diode D1 or D2 in an on state, the gap of the connection between the first or second slot line 121 or 122 and a corresponding sub open-end circuit is electrically shorted. Hence, the corresponding first or second sub open-end circuit 121b or 122b has no influence on the first or second slot line 121 or 122. On the other hand, the first or second sub open-end circuit 121b or 122b whose connected gap is not shorted forms an open-end circuit for the first or second slot line 121 or 122. Thus, the first or second slot line 121 or 122 is opened at the connection to the first or second sub open-end circuit 121b or 122b. Since no signals are transferred to the first or second microstrip line 111 or 112 associated with the opened first or second slot line 121 or 122, the signal path of the first or second microstrip line 111 or 122 is selectively connected to the third microstrip line 113.

As the first, second and third ports 1, 2 and 3 of the microstrip lines 111, 112 and 113 are connected to a Tx end, an Rx end, and an ANT end, respectively, the RF switch 10 having the above configuration can be used as a switching device for Tx-Rx switching in the TDD system.

The operation of the RF switch 10 as the Tx-Rx switch in the TDD system will be described below.

For transmission, the first diode D1 is turned on and the second diode D2 is turned off. When a Tx signal travels along the first microstrip line 111, it is transferred to the first slot line 121 through microstrip-slot line coupling. The Tx signal is then transferred to the third microstrip line 113 through microstrip-slot line coupling. The Tx signal is finally radiated through the ANT.

Since the first diode D1 is in the on state, the gap of the connection between the first sub open-end circuit 121b and the first slot line 121 is shorted and the first sub open-end circuit 121b has no influence on the first slot line 121. The Tx signal does not travel to the second microstrip line 112. The reason is that since the second diode D2 is in the off state, the second slot line 122 is connected to the second sub open-end circuit 122b and thus the second slot line 122 is opened at the connection to the second sub open-end circuit 122b.

For reception, the first diode D1 is turned off and the second diode D2 is turned on. An Rx signal received through the third microstrip line 113 is sent to the second microstrip line 112 via the second slot line 122. The Rx signal is finally delivered to the Rx end.

Since the second diode D2 is in the on state, the second sub open-end circuit 122b has no influence on the second slot line 122. Because the first diode D1 is in the off state, the first slot line 121 is opened at its connection to the first sub open-end circuit 121b. Therefore, the Rx signal is not sent to the first microstrip line 111 via the first slot line 121.

In this manner, one end of a slot line is grounded to separate transmission from reception. For this purpose, a microstrip-slot line coupling configuration is formed and a semiconductor switch is used to control grounding. Therefore, a high-power Tx signal has no direct influence on a semiconductor device, i.e. a diode and thus stable switching is achieved.

Figure 1:
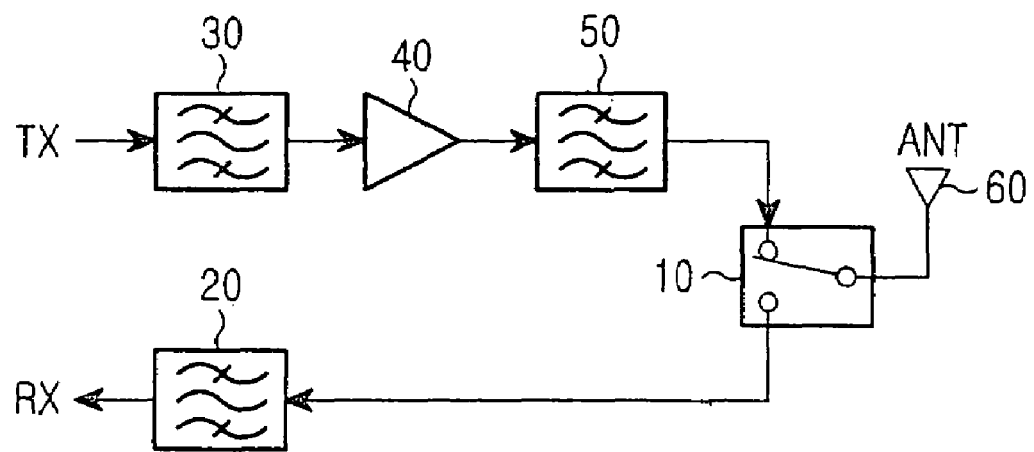
FIG. 1 is a block diagram of exemplary Tx and Rx ends in a typical TDD system.
Figure 7:
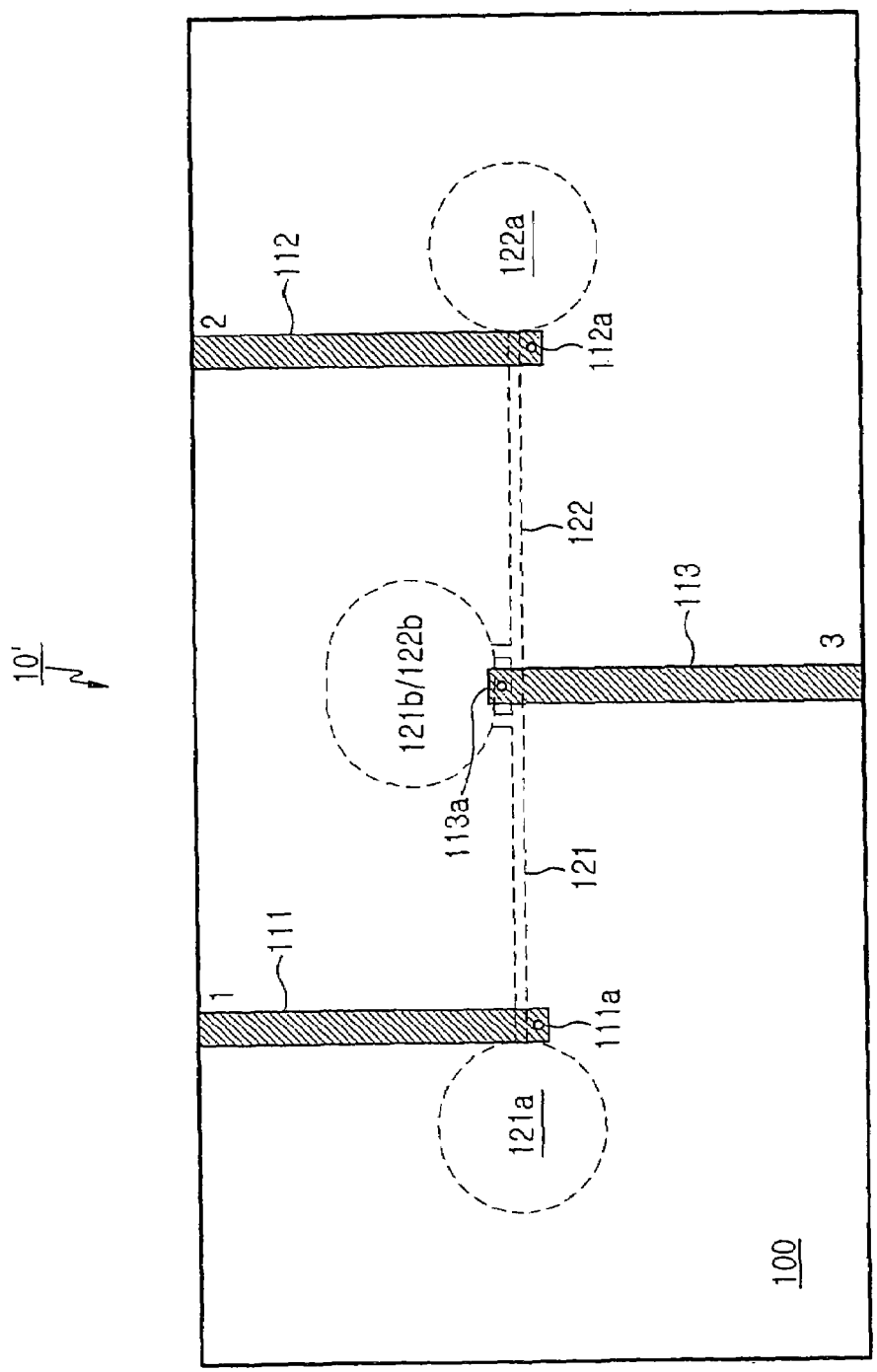
FIG. 7 is a plan view of the circuit pattern of the PCB of an RF switch for Tx-Rx switching in a TDD system according to another embodiment of the present invention.
Figure 8:
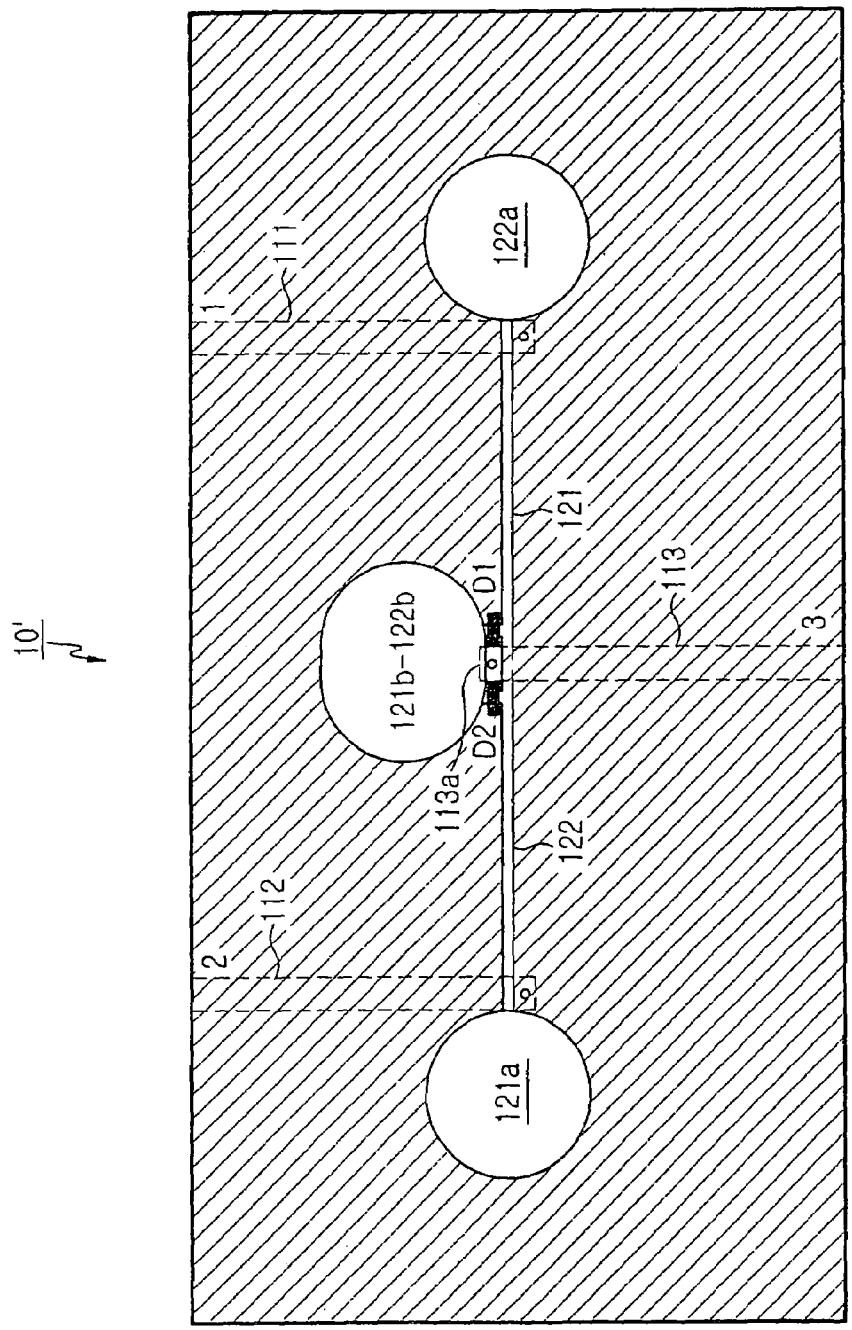
FIG. 8 is a bottom view of the circuit pattern of the PCB illustrated in FIG. 7.

FIG. 7 is a plan view of the circuit pattern of the PCB of an RF switch for Tx-Rx switching in a TDD system according to another embodiment of the present invention and FIG. 8 is a bottom view of the circuit pattern of the PCB illustrated in FIG. 7. The RF switch according to the second embodiment of the present invention is similar to that illustrated in FIG. 1 in configuration except for the configuration of the sub open-end circuit 121b-122b.

Referring to FIGS. 7 and 8, in an RF switch 10' according to the second embodiment of the present invention, the first and second sub open-end circuits 121b and 122b are partially overlapped with each other, so that they form one oval open-end circuit common to them. The first and second sub open-end circuits 121b and 122n are connected to the first and second slot lines 121 and 122 in the vicinity of the third microstrip line 113.

The sub open-end circuits 121b and 122b are so configured as to improve impedance matching between the third microstrip line and the slot line 121b-122b in the RF switch 10' according to the second embodiment of the present invention.

The RF switch 10' operates in the same manner as the RF switch 10 of the first embodiment.

While the invention has been shown and described with reference to certain preferred embodiments thereof, they are mere exemplary applications. For example, the microstrip lines can be replaced with strip lines, coaxial cables, or Coplanar Waveguides (CPWs). Also, Coplanar Strips may substitute for the slot lines. While diodes are adopted as switching devices in the embodiments, any other semiconductor device with the switching function (e.g. FETs) can be used.

Therefore, it will be understood by those skilled in the art that various changes in form and details may be made therein without departing from the spirit and scope of the invention as defined by the appended claims.

INDUSTRIAL USABILITY

As described above, the Tx-Rx switching device for a TDD system according to the present invention ensures sufficient isolation between Tx and Rx paths.

Tx power fully reflected and introduced into an Rx end can be remarkably reduced even when an antenna is opened.

Since a Tx signal is transferred along a slot line with a sufficient ground plate, high-speed switching is enabled using a semiconductor device and that at a high power level.

Due to easy application in the form of an MIC, the Tx-Rx switching circuit can be fabricated during a general semiconductor process.

Furthermore, the Tx-Rx switch can be used in an RF band of tens of giga hertz or above as well as in a mobile communication frequency band. Therefore, it can be easily applied to satellite communications and military radars.

What is claimed is:

1. A radio frequency switch comprising:
   a slot line divided into a first slot line and a second slot line and having an open-end circuit at each end of the first and second slot lines;
   a first transmission line for delivering signals to and from the first slot line;
   a second transmission line for delivering signals to and from the second slot line;
   a third transmission line for delivering signals to and from a separation portion which divides the first slot line from the second slot line; and
   a variable sub open-end circuit portion having at least one open-end circuit for selectively connecting to the first or second slot line according to an external switching control signal.

2. The radio frequency switch of claim 1, wherein the variable sub open-end circuit portion includes:
   a sub open-end circuit having a first sub open-end circuit connected to the first slot line and a second sub open-end circuit connected to the second slot line; and
   a switching circuit for forming mutually exclusive connection paths for connection the first or second sub open-end circuit to the first or second slot line according to the switching control signal.

3. The radio frequency device of claim 2, wherein the first and second sub open-end circuits are partially overlapped with each other so as to one open-end circuit common to the first and second sub open-end circuits and the first or second sub open-end circuit is connected to the first or second slot line in the vicinity of the third transmission line.

4. The radio frequency switch of claim 2, the switching circuit includes first and second switching devices formed to selectively short the gap of a connection between the first sub open-end circuit and the first slot line or the gap of a connection between the second sub open-end circuit and the second slot line according to the switching control signal.

5. The radio frequency switch of claim 4, wherein the first and second switching devices are diodes or field effect transistors (FETs).

6. The radio frequency switch of claim 1, wherein each of the first, second and third transmission lines is one of a microstrip line, a strip line, a coaxial line, and a coplanar waveguide (CPW).

7. The radio frequency switch of claim 1, wherein each of the first, second and third transmission lines is provided, at one end thereof, with an open-end or short-end circuit.

8. A radio frequency switch for switching between transmission and reception in a time division duplexing/multiplexing system, comprising:
   a slot line divided into a first slot line and a second slot line and having an open-end circuit at each end of the first and second slot lines;
   a first transmission line for delivering a transmission signal received from a transmission end to the first slot line;
   a second transmission line for delivering a reception signal received from the second slot line to a reception end;
   a third transmission line for delivering the transmission signal and the reception signal to and from a separation portion which divides the first slot line from the second slot line; and
   a variable sub open-end circuit portion with at least one open-end circuit for selectively connecting to the first or second slot line according to an external switching control signal.

9. The radio frequency switch of claim 8, wherein the variable sub open-end circuit portion includes:
   a sub open-end circuit having a first sub open-end circuit connected to the first slot line and a second sub open-end circuit connected to the second slot line; and
   a switching circuit for forming mutually exclusive connection paths for connection the first or second sub open-end circuit to the first or second slot line according to the switching control signal.

10. The radio frequency device of claim 9, wherein the first and second sub open-end circuits are partially overlapped with each other so as to one open-end circuit common to the first and second sub open-end circuits and the first or second sub open-end circuit is connected to the first or second slot line in the vicinity of the third transmission line.

11. The radio frequency switch of claim 9, the switching circuit includes first and second switching devices formed to selectively short the gap of a connection between the first sub open-end circuit and the first slot line or the gap of a connection between the second sub open-end circuit and the second slot line according to the switching control signal.

12. The radio frequency switch of claim 11, wherein the first and second switching devices are diodes or field effect transistors (FETs).

13. The radio frequency switch of claim 8, wherein each of the first, second and third transmission lines is one of a microstrip line, a strip line, a coaxial line, and a coplanar waveguide (CPW).

14. The radio frequency switch of claim 8, wherein each of the first, second and third transmission lines is provided, at one end thereof, with an open-end or short-end circuit.

\* \* \* \* \*

UNITED STATES PATENT AND TRADEMARK OFFICE
CERTIFICATE OF CORRECTION

PATENT NO. : 7,605,674 B2  Page 1 of 1
APPLICATION NO. : 12/151681
DATED : October 20, 2009
INVENTOR(S) : Duk-Yong Kim It is certified that error appears in the above-identified patent and that said Letters Patent is hereby corrected as shown below:

On the Title Page
Item [73], Assignee's address, should read as follows:

--KMW Inc.
  65 Youngchon-ri, Tongtan-myon, Hwasong-shi, Kyonggi-do, Republic of Korea.--

Signed and Sealed this

Twenty-fourth Day of November, 2009

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,605,674 B2 | Page 1 of 1 |
| APPLICATION NO. | : 12/151681 | |
| DATED | : October 20, 2009 | |
| INVENTOR(S) | : Duk-Yong Kim et al. | |

It is certified that error appears in the above-identified patent and that said Letters Patent is hereby corrected as shown below:

Column 1, beginning with line 3, should read as follows:

--This application is a Continuation of PCT/KR2005/004068 filed on November 30, 2005, which in turn claims a priority to a Korean Patent Application 2005-106689 filed on November 8, 2005.--

Signed and Sealed this

Twenty-seventh Day of July, 2010

David J. Kappos
*Director of the United States Patent and Trademark Office*